US009531155B2

United States Patent
Wang et al.

(10) Patent No.: US 9,531,155 B2
(45) Date of Patent: Dec. 27, 2016

(54) SWITCHED RADIO FREQUENCY (RF) DRIVER FOR TUNABLE LASER WITH MULTIPLE IN-LINE SECTIONS

(71) Applicant: Applied Optoelectronics, Inc., Sugar Land, TX (US)

(72) Inventors: Yi Wang, Katy, TX (US); Jun Zheng, Missouri City, TX (US); Yanyan Zhang, Missouri City, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 14/248,553

(22) Filed: Apr. 9, 2014

(65) Prior Publication Data

US 2015/0295385 A1    Oct. 15, 2015

(51) Int. Cl.
| | |
|---|---|
| H04B 10/00 | (2013.01) |
| H01S 5/062 | (2006.01) |
| H01S 5/068 | (2006.01) |
| H01S 5/024 | (2006.01) |
| H04B 10/50 | (2013.01) |
| H04J 14/02 | (2006.01) |

(52) U.S. Cl.
CPC ............... *H01S 5/062* (2013.01); *H01S 5/024* (2013.01); *H01S 5/06804* (2013.01); *H01S 5/06817* (2013.01); *H04B 10/503* (2013.01); *H04B 10/506* (2013.01); *H04J 14/02* (2013.01); *H04J 14/0246* (2013.01); *H04J 14/0256* (2013.01); *H04J 14/0282* (2013.01)

(58) Field of Classification Search
USPC .................................................. 398/192–198
See application file for complete search history.

(56) References Cited

U.S. PATENT DOCUMENTS 5,212,706 A * 5/1993 Jain ...................... B82Y 20/00
                                                                    372/23
5,581,572 A * 12/1996 Delorme ............. H01S 5/06256
                                                                    372/102

(Continued)

OTHER PUBLICATIONS

"Small Form Factor Transceiver Multisource Agreement—Cooperation Agreement for Small Form Factor Transceivers", Jan. 6, 1998, pp. 1-8.

(Continued)

*Primary Examiner* — Agustin Bello
(74) *Attorney, Agent, or Firm* — Grossman Tucker Perreault & Pfleger, PLLC; Norman S. Kinsella

(57) ABSTRACT

A tunable laser with multiple in-line sections generally includes a semiconductor laser body with a plurality of in-line laser sections each configured to be driven independently to generate laser light at a wavelength within a different respective wavelength range. The wavelength of the light generated in each of the laser sections may be tuned, in response to a temperature change, to a channel wavelength within the respective wavelength range. A switch module may be configured to couple a signal from a laser driver to a selected one of the plurality of in-line laser sections, wherein the signal modulates the laser light generated by the in-line laser section. The selected in-line section may be DC biased to a lasing state and the non-selected in-line sections may be DC biased to a non-lasing or transparent state.

19 Claims, 5 Drawing Sheets

(56) References Cited

U.S. PATENT DOCUMENTS

| | | | | |
|---|---|---|---|---|
| 5,914,976 A * | 6/1999 | Jayaraman | | H01S 5/0262 372/50.21 |
| 6,043,104 A * | 3/2000 | Uchida | | B82Y 20/00 257/94 |
| 6,215,804 B1 * | 4/2001 | Sahlen | | H01S 5/4031 372/26 |
| 6,501,773 B1 * | 12/2002 | Volz | | H01S 5/0687 372/29.01 |
| 6,553,044 B1 * | 4/2003 | Eden | | H01S 5/4031 372/34 |
| 6,628,686 B1 * | 9/2003 | Sargent | | B82Y 20/00 372/46.01 |
| 6,690,693 B1 * | 2/2004 | Crowder | | B82Y 20/00 372/29.01 |
| 6,788,719 B2 * | 9/2004 | Crowder | | B82Y 20/00 372/29.015 |
| 6,829,283 B2 * | 12/2004 | Ebeling | | H01S 5/426 372/23 |
| 7,412,170 B1 * | 8/2008 | Louderback | | H01S 5/423 398/158 |
| 7,457,337 B2 * | 11/2008 | Kan | | H01S 5/042 257/664 |
| 7,483,453 B2 * | 1/2009 | Diffily | | H01S 5/06256 372/18 |
| 7,599,411 B2 * | 10/2009 | Kim | | G02B 6/12004 372/23 |
| 7,649,917 B2 * | 1/2010 | Mullane | | H01S 5/0625 372/20 |
| 7,813,391 B2 * | 10/2010 | Tanaka | | H01S 5/0612 372/102 |
| 7,924,893 B2 * | 4/2011 | Farrell | | H01S 5/0687 372/20 |
| 8,089,074 B2 * | 1/2012 | Kim | | H01L 27/153 257/79 |
| 8,259,770 B2 * | 9/2012 | Tagansky | | B41J 2/45 347/119 |
| 8,311,071 B2 * | 11/2012 | Kato | | H01S 5/06256 372/102 |
| 8,457,166 B2 * | 6/2013 | Shibata | | H01S 5/0617 372/20 |
| 8,681,826 B2 * | 3/2014 | Tanaka | | H01S 5/06258 372/20 |
| 8,687,665 B1 * | 4/2014 | Tauke-Pedretti | | H01S 5/0265 372/25 |
| 8,737,446 B2 * | 5/2014 | Fukuda | | H01S 5/026 372/43.01 |
| 8,867,579 B2 * | 10/2014 | Goobar | | H01S 5/06817 372/20 |
| 8,908,723 B2 * | 12/2014 | Yoffe | | H01S 5/1032 372/101 |
| 8,923,348 B2 * | 12/2014 | Liu | | H01S 5/02248 372/20 |
| 8,929,746 B2 * | 1/2015 | Azadeh | | H01S 5/042 398/192 |
| 9,025,628 B2 * | 5/2015 | Ishikawa | | H01S 5/0265 372/20 |
| 9,130,353 B2 * | 9/2015 | Lell | | H01S 5/4043 |
| 9,214,601 B1 * | 12/2015 | Chen | | H01L 33/08 |
| 2002/0009258 A1 * | 1/2002 | Coldren | | G02B 6/4202 385/24 |
| 2003/0152384 A1 * | 8/2003 | Hagimura | | H04B 10/07 398/33 |
| 2004/0076209 A1 * | 4/2004 | Bour | | B82Y 20/00 372/45.01 |
| 2004/0136423 A1 * | 7/2004 | Coldren | | B82Y 20/00 372/38.02 |
| 2005/0169327 A1 * | 8/2005 | Eden | | H01S 5/4031 372/29.02 |
| 2007/0230521 A1 * | 10/2007 | Ishikawa | | H01S 5/02276 372/34 |
| 2008/0019693 A1 * | 1/2008 | Sorin | | H04Q 11/0067 398/71 |
| 2008/0123710 A1 * | 5/2008 | Brick | | B82Y 20/00 372/50.1 |
| 2009/0001389 A1 * | 1/2009 | Wang | | H01L 27/15 257/89 |
| 2009/0168817 A1 * | 7/2009 | Ishikawa | | H01S 5/0687 372/20 |
| 2010/0296532 A1 * | 11/2010 | Tanaka | | H01S 5/06256 372/20 |
| 2011/0158643 A1 * | 6/2011 | Yamazaki | | H04B 10/572 398/38 |
| 2011/0200062 A1 * | 8/2011 | Shibata | | H01S 5/0617 372/20 |
| 2011/0268457 A1 * | 11/2011 | Xu | | H03F 1/083 398/155 |
| 2012/0301151 A1 * | 11/2012 | Hu | | H04B 10/40 398/135 |
| 2012/0301152 A1 * | 11/2012 | Edwards | | G02B 6/4201 398/135 |
| 2013/0094854 A1 * | 4/2013 | Yan | | H01S 5/06256 398/38 |
| 2014/0328595 A1 * | 11/2014 | Han | | H04B 10/2575 398/115 |
| 2014/0341579 A1 * | 11/2014 | Effenberger | | H04J 14/0221 398/68 |
| 2015/0008327 A1 * | 1/2015 | Caneau | | G01N 21/39 250/341.8 |
| 2015/0078751 A1 * | 3/2015 | Zheng | | H04B 10/503 398/79 |
| 2015/0104179 A1 * | 4/2015 | Wang | | H04B 10/564 398/81 |
| 2015/0139651 A1 * | 5/2015 | Xuejin | | H04B 10/27 398/75 |
| 2015/0295385 A1 * | 10/2015 | Wang | | H01S 5/062 398/79 |
| 2015/0357791 A1 * | 12/2015 | Zheng | | H01S 5/06258 398/69 |

OTHER PUBLICATIONS

"Small Form-Factor Pluggable (SFP) Transceiver MultiSource Agreement (MSA)—Cooperation Agreement for Small Form-Factor Pluggable Transceivers", Sep. 14, 2000, pp. 1-38.

* cited by examiner

SWITCHED RADIO FREQUENCY (RF) DRIVER FOR TUNABLE LASER WITH MULTIPLE IN-LINE SECTIONS

TECHNICAL FIELD

The present invention relates to switched driven tunable lasers and more particularly, to a switched driven tunable laser with multiple in-line sections configured for tuning within multiple different ranges of channel wavelengths for use in tunable transmitters or transceivers in a wavelength division multiplexed (WDM) passive optical network (PON).

BACKGROUND INFORMATION

Optical communications networks, at one time, were generally "point to point" type networks including a transmitter and a receiver connected by an optical fiber. Such networks are relatively easy to construct but deploy many fibers to connect multiple users. As the number of subscribers connected to the network increases and the fiber count increases rapidly, deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. One challenge in developing such a PON is utilizing the capacity in the trunk fiber efficiently in order to transmit the maximum possible amount of information on the trunk fiber. Fiber optic communications networks may increase the amount of information carried on a single optical fiber by multiplexing different optical signals on different wavelengths using wavelength division multiplexing (WDM). In a WDM-PON, for example, the single trunk fiber carries optical signals at multiple channel wavelengths to and from the optical branching point and the branching point provides a simple routing function by directing signals of different wavelengths to and from individual subscribers. At each subscriber location, an optical networking terminal (ONT) or optical networking unit (ONU) is assigned one or more of the channel wavelengths for sending and/or receiving optical signals.

A challenge in a WDM-PON, however, is designing a network that will allow the same transmitter to be used in an ONT or ONU at any subscriber location. For ease of deployment and maintenance in a WDM-PON, it is desirable to have a "colorless" ONT/ONU whose wavelength can be changed or tuned such that a single device could be used in any ONT/ONU on the PON. With a "colorless" ONT/ONU, an operator only needs to have a single, universal transmitter or transceiver device that can be employed at any subscriber location.

One or more tunable lasers may be used to select different wavelengths for optical signals in a WDM system or network such as a WDM-PON. Various different types of tunable lasers have been developed over the years, but most were developed for high-capacity backbone connections to achieve high performance and at a relatively high cost. Many WDM-PON applications have lower data rates and shorter transmission distances as compared to high-capacity, long-haul WDM systems, and thus a lower performance and lower cost laser may suffice. The less expensive tunable lasers, however, often present challenges when used to cover a relatively wide range of channels (e.g., 16 channels) in a WDM-PON. In less expensive DFB lasers that are tuned by controlling the temperature, for example, the wavelength changes by only about 0.1 nm/° C. A temperature range of 120° C. would be needed to cover 16 channel wavelengths using such a laser.

BRIEF DESCRIPTION OF THE DRAWINGS

These and other features and advantages will be better understood by reading the following detailed description, taken together with the drawings wherein.

DETAILED DESCRIPTION

Figure 1:
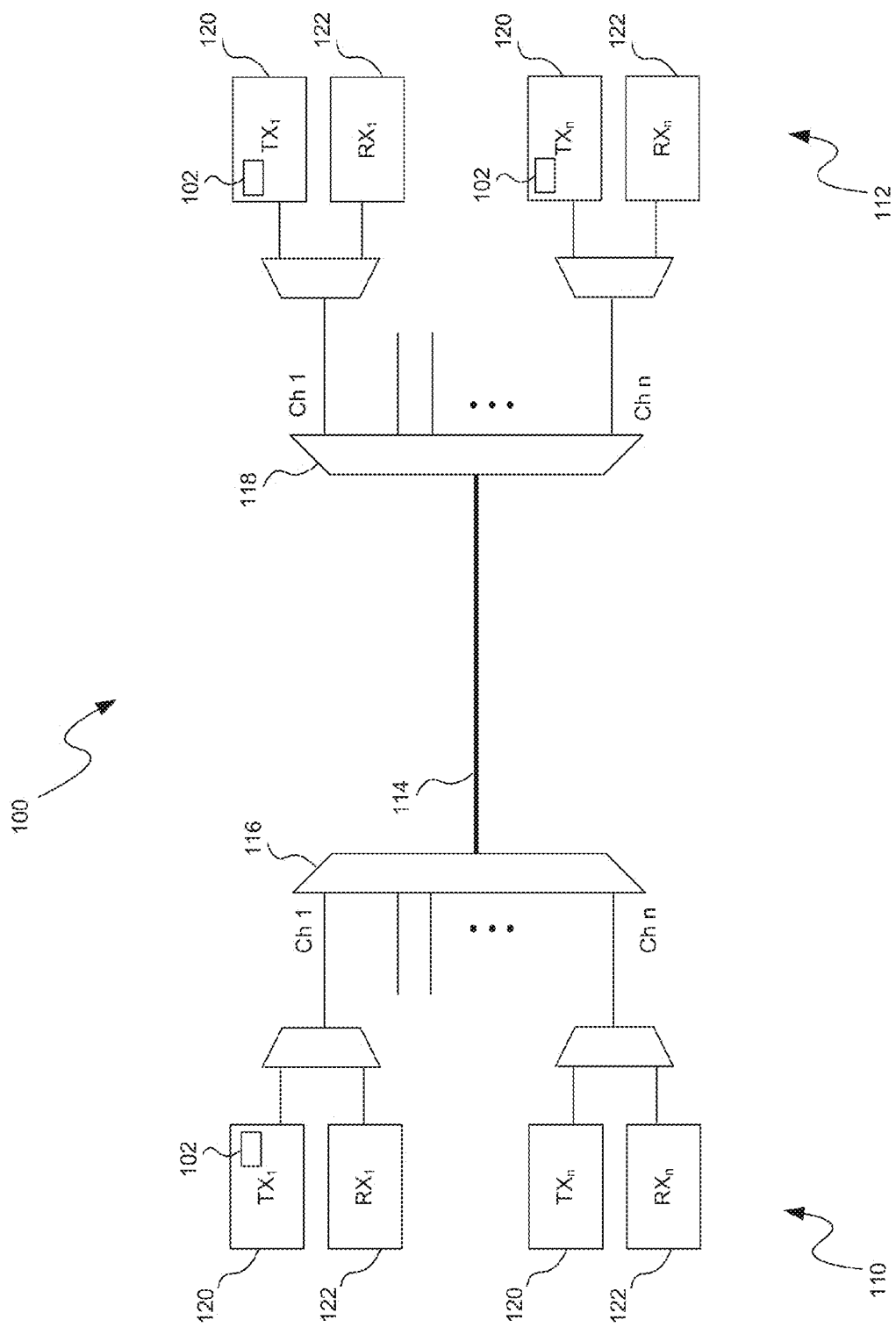
FIG. 1 is a schematic diagram of a wavelength division multiplexed (WDM) optical communication system including at least one multiple-section tunable laser, consistent with embodiments of the present disclosure.

A switched driven tunable laser with multiple in-line sections or segments, consistent with embodiments described herein, generally includes a semiconductor laser body with a plurality of in-line laser sections each configured to be driven independently to generate laser light at a wavelength within a different respective wavelength range. The wavelength of the light generated in each of the laser sections may be tuned, in response to a temperature change, to a channel wavelength within the respective wavelength range. A switching circuit may be configured to couple a laser driver, which provides a modulating signal, to a selected one of the multiple in-line sections to generate laser light at a desired wavelength for transmission of the signal over an optical network. The switching circuit may be a single pole multi-throw radio frequency (RF) switch, where the number of throw positions corresponds to the number of in-line laser sections. It will be appreciated that the switching circuit, which may permit the use of a single laser driver instead of multiple drivers, one for each of the laser sections, may provide for a decrease in size and cost of the laser system.

In some embodiments, alternating-current (AC) coupling may be employed between the laser driver and the selected in-line section to provide impedance matching. A direct-current (DC) bias driver may also be provided for each in-line section. The DC bias current generated for the selected in-line section may be adjusted to induce lasing in that section, while the other sections may be biased to either an off state or a transparent state.

The tunable laser with multiple in-line sections may be used, for example, in a tunable transmitter, to generate an optical signal at a selected channel wavelength and/or in a multiplexing optical transmitter to generate and combine optical signals at multiple different channel wavelengths. In one application, the tunable laser with multiple in-line sections may be used in optical transmitters or transceivers in a wavelength division multiplexed (WDM) optical system. A tunable laser with multiple in-line sections may be used, for example, in a tunable transmitter or transceiver in a WDM system such as an optical networking terminal (ONT) or optical networking unit (ONU) in a WDM passive optical network (PON) to select the appropriate transmission channel wavelength for the ONT/ONU. A tunable laser with multiple in-line sections may also be used, for example, in an optical line terminal (OLT) in a WDM-PON to provide multiple optical signals at different channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component.

Referring to FIG. 1, a WDM optical communication system 100 including one or more multiple-section tunable lasers 102 that may be switch driven, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $T_{X1}$ to $T_{Xa}$) and receivers 122 (e.g., $R_{X1}$ to $R_{Xa}$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114. One or more of the transmitters 120 may be a tunable transmitter capable of being tuned to the appropriate channel wavelength using a multiple-section tunable laser 102, where a selected section of the laser is controllably coupled to a laser driver through a switch, as will be described in greater detail below. Thus, the transmitters 120 may be constructed as universal, tunable transmitters capable of being used in different locations in the WDM system 100 and tuned to the appropriate channel wavelength depending upon the location in the WDM system 100.

Figure 2:
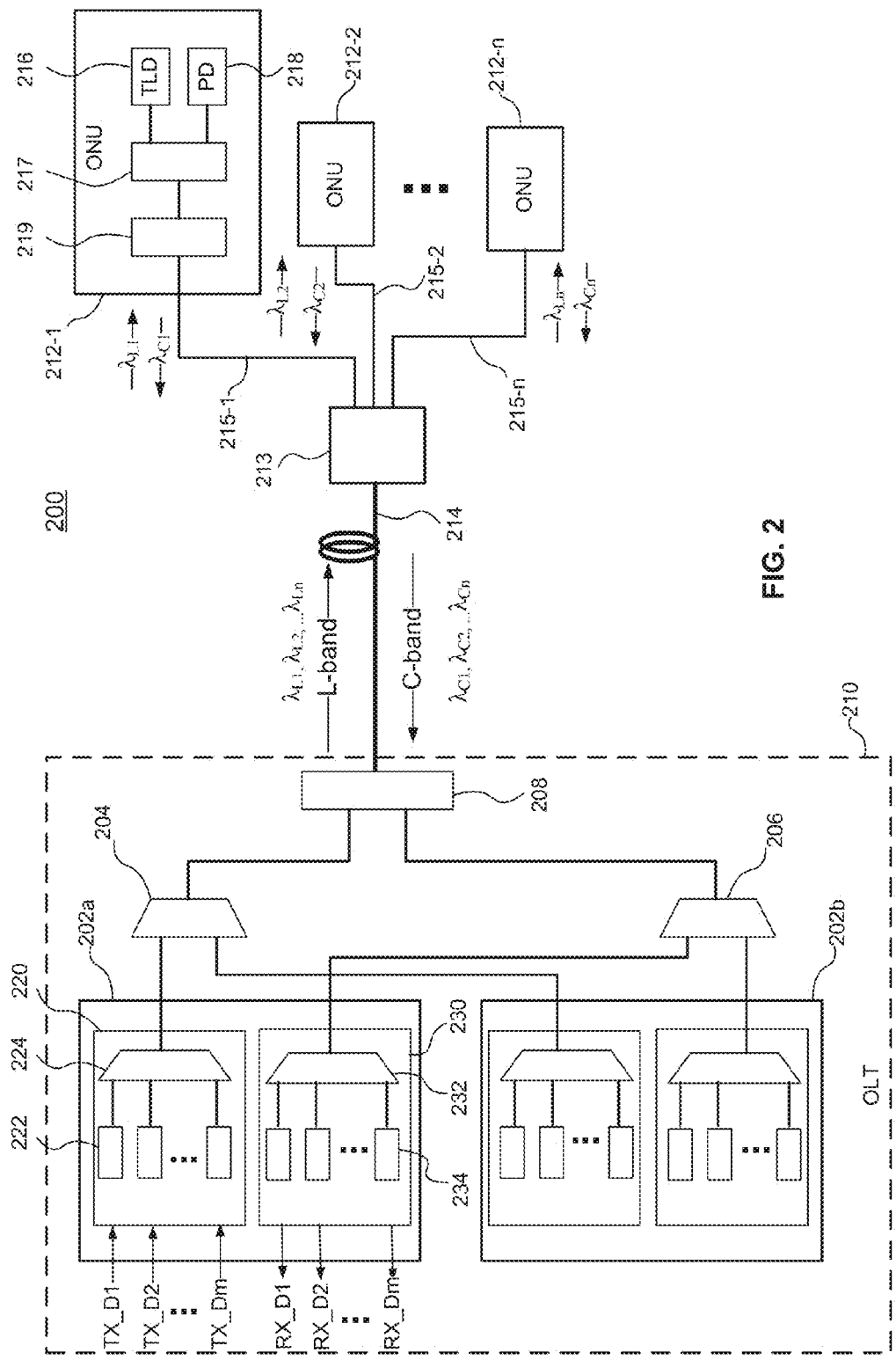
FIG. 2 is a schematic diagram of a wavelength division multiplexed (WDM) passive optical network (PON) including at least one multiple-section tunable laser, consistent with embodiments of the present disclosure.

Referring to FIG. 2, one or more multiple-section tunable lasers, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, at least one optical line terminal (OLT) 210 may be coupled to a plurality of optical networking terminals (ONTs) or optical networking units (ONUs) 212-1 to 212-n via optical fibers, waveguides, and/or paths 214, 215-1 to 215-n. The OLT 210 includes one or more multi-channel optical transceivers 202a, 202b. Multiple-section tunable lasers 102 may be used in the ONTs/ONUs and/or in the OLT 210 to allow tuning to a channel wavelength, as described in greater detail below.

The OLT 210 may be located at a central office of the WDM-PON 200, and the ONUs 212-1 to 212-n may be located in homes, businesses or other types of subscriber location or premises. A branching point 213 (e.g., a remote node) couples a trunk optical path 214 to the separate optical paths 215-1 to 215-n to the ONUs 212-1 to 212-n at the respective subscriber locations. The branching point 213 may include one or more passive coupling devices such as a splitter or optical multiplexer/demultiplexer. In one example, the ONUs 212-1 to 212-n may be located about 20 km or less from the OLT 210.

The WDM-PON 200 may also include additional nodes or network devices, such as Ethernet PON (EPON) or Gigabit PON (GPON) nodes or devices, coupled between the branching point 213 and ONUs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 200, different ONUs 212-1 to 212-n may be assigned different channel wavelengths for transmitting and receiving optical signals. In one embodiment, the WDM-PON 200 may use different wavelength bands for transmission of downstream and upstream optical signals relative to the OLT 210 to avoid interference between the received signal and back reflected transmission signal on the same fiber. For example, the L-band (e.g., about 1565 to 1625 nm) may be used for downstream transmissions from the OLT 210 and the C-band (e.g., about 1530 to 1565 nm) may be used for upstream transmissions to the OLT 210. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 212-1 to 212-n may thus be assigned different channel wavelengths within the L-band and within the C-band. Transceivers or receivers located within the ONUs 212-1 to 212-n may be configured to receive an optical signal on at least one channel wavelength in the L-band (e.g., $\lambda_{L1}, \lambda_{L2}, \ldots \lambda_{Ln}$). Transceivers or transmitters located within the ONUs 212-1 to 212-n may be configured to transmit an optical signal on at least one channel wavelength in the C-band (e.g., $\lambda_{C1}, \lambda_{C2}, \ldots \lambda_{Cn}$). Other wavelengths and wavelength bands are also within the scope of the system and method described herein.

The branching point 213 may demultiplex a downstream WDM optical signal (e.g., $\lambda_{L1}, \lambda_{L2}, \ldots \lambda_{Ln}$) from the OLT 210 for transmission of the separate channel wavelengths to the respective ONUs 212-1 to 212-n. Alternatively, the branching point 213 may provide the downstream WDM optical signal to each of the ONUs 212-1 to 212-n and each of the ONUs 212-1 to 212-n separates and processes the assigned optical channel wavelength. The individual optical signals may be encrypted to prevent eavesdropping on optical channels not assigned to a particular ONU. The branching point 213 also combines or multiplexes the upstream optical signals from the respective ONUs 212-1 to 212-n for transmission as an upstream WDM optical signal (e.g., $\lambda_{C1}, \lambda_{C2}, \ldots \lambda_{Cn}$) over the trunk optical path 214 to the OLT 210.

One embodiment of the ONU 212-1 includes a laser 216 for transmitting an optical signal at the assigned upstream channel wavelength ($\lambda_{C1}$) and a photodetector 218, such as a photodiode, for receiving an optical signal at the assigned downstream channel wavelength ($\lambda_{L1}$). The laser 216 may include a multiple-section tunable laser 102 configured to be tuned to the assigned channel wavelength, for example, by changing a temperature of the laser 216. This embodiment of the ONU 212-1 may also include a diplexer 217 coupled to the laser 216 and the photodetector 218 and a C+L band filter 219 coupled to the diplexer 217, which allow the L-band channel wavelength ($\lambda_{L1}$) to be received by the ONU 212-1 and the C-band channel wavelength ($\lambda_{C1}$) to be transmitted by the ONU 212-1. The ONU 212-1 may also include a temperature control system for controlling a temperature of the laser 216, laser driver circuitry for driving the laser 216 and a controllable switch to couple the laser driver to a selected section of the laser.

The OLT 210 may be configured to generate multiple optical signals at different channel wavelengths (e.g., $\lambda_{L1}, \lambda_{L2}, \ldots \lambda_{Ln}$) and to combine the optical signals into the downstream WDM optical signal carried on the trunk optical fiber or path 214. Each of the OLT multi-channel optical transceivers 202a, 202b may include a multi-channel transmitter optical subassembly (TOSA) 220 for generating and combining the optical signals at the multiple channel wavelengths. The OLT 210 may also be configured to separate optical signals at different channel wavelengths (e.g., $\lambda_{C1}, \lambda_{C2}, \ldots \lambda_{Cn}$) from an upstream WDM optical signal carried on the trunk path 214 and to receive the separated optical signals. Each of the OLT multi-channel optical transceivers 202a, 202b may thus include a multi-channel receiver optical subassembly (ROSA) 230 for separating and receiving the optical signals at multiple channel wavelengths.

One embodiment of the multi-channel TOSA 220 includes an array of lasers 222, which may be modulated by respective RF data signals (TX_D1 to TX_Dm) to generate the respective optical signals. The lasers 222 may include multiple-section tunable lasers as described herein. The lasers 222 may be modulated using various modulation techniques including external modulation and direct modulation. An optical multiplexer 224, such as an arrayed waveguide grating (AWG), combines the optical signals at the different respective downstream channel wavelengths (e.g., $\lambda_{L1}, \lambda_{L2}, \ldots \lambda_{Lm}$). The lasers 222 may be tuned to the channel wavelengths by changing a temperature of the lasers 222. The TOSA 220 may also include a temperature control system for controlling temperature of the lasers 222 and the multiplexer 224 to maintain a desired wavelength precision or accuracy.

In the illustrated embodiment, the OLT 210 further includes a multiplexer 204 for multiplexing the multiplexed optical signal from the multi-channel TOSA 220 in the multi-channel transceiver 202a with a multiplexed optical signal from a multi-channel TOSA in the other multi-channel transceiver 202b to produce the downstream aggregate WDM optical signal.

One embodiment of the multi-channel ROSA 230 includes a demultiplexer 232 for separating the respective upstream channel wavelengths (e.g., $\lambda_{C1}, \lambda_{C2}, \ldots \lambda_{Cn}$). An array of photodetectors 234, such as photodiodes, detects the optical signals at the respective separated upstream channel wavelengths and provides the received data signals (RX_D1 to RX_Dm). In the illustrated embodiment, the OLT 210 further includes a demultiplexer 206 for demultiplexing the upstream WDM optical signal into first and second WDM optical signals provided to the respective multi-channel ROSA in each of the transceivers 202a, 202b. The OLT 210 also includes a diplexer 208 between the trunk path 214 and the multiplexer 204 and the demultiplexer 206 such that the trunk path 214 carries both the upstream and the downstream channel wavelengths. The transceivers 202a, 202b may also include other components, such as laser drivers, transimpedance amplifiers (TIAs), and control interfaces, used for transmitting and receiving optical signals.

In one example, each of the multi-channel optical transceivers 202a, 202b may be configured to transmit and receive 16 channels such that the WDM-PON 200 supports 32 downstream L-band channel wavelengths and 32 upstream C-band channel wavelengths. One example of the WDM-PON 200 may operate at 1.25 Gbaud using on-off keying as the modulation scheme. Other data rates and modulation schemes may also be used.

As mentioned above, the upstream and downstream channel wavelengths may span a range of channel wavelengths on the 100 GHz ITU grid. Each of the transceivers 202a, 202b, for example, may cover 16 channel wavelengths in the L-band for the TOSA and 16 channel wavelengths in the C-band for the ROSA such that the transceivers 202a, 202b together cover 32 channels. Thus, the multiplexer 204 may combine 16 channels from one transceiver 202a with 16 channels from the other transceiver 202b, and the demultiplexer 206 may separate a 32 channel WDM optical signal into two 16 channel WDM optical signals. To facilitate use of the multiplexer 204 and the demultiplexer 206, the range of channel wavelengths may skip channels in the middle of the range. According to one example of a multi-channel optical transceiver used in the WDM-PON 200, the desired wavelength precision or accuracy is ±0.05 nm, and the desired operating temperature is between −5 and 70° C.

Figure 3:
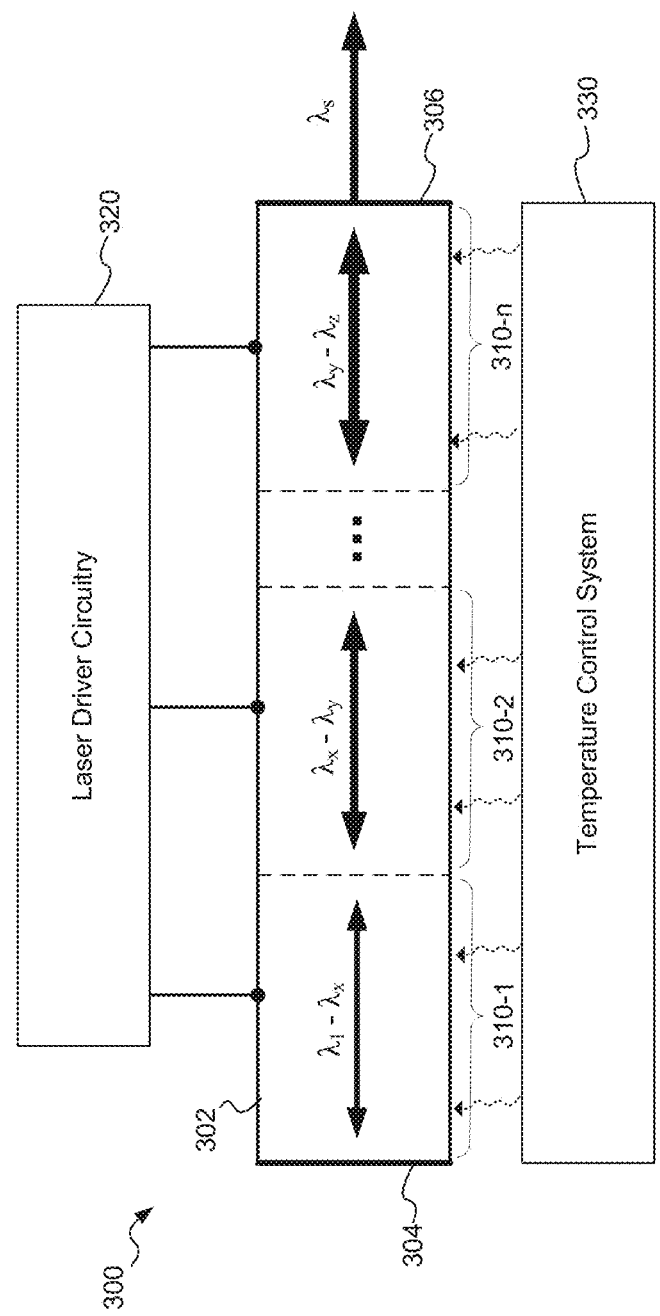
FIG. 3 is a schematic diagram of a multiple-section tunable laser, consistent with embodiments of the present disclosure.

Referring to FIG. 3, a multiple-section tunable laser 300 capable of being used in a WDM system, such as a WDM-PON, is described in greater detail. The multiple-section tunable laser 300 includes a semiconductor laser body 302 extending between a back facet 304 and a front facet 306. The laser body 302 includes a plurality of in-line thermally tunable laser sections 310-1 to 310-n arranged "in line" from the back facet 304 to the front facet 306. As will be described in greater detail below, each of the in-line laser sections 310-1 to 310-n may be configured to generate laser light within a different respective wavelength range, for example, by using different cavity lengths and/or grating structures. Each of the in-line laser sections 310-1 to 310-n may be contiguous with one or more adjacent in-line laser sections such that the laser body 302 is formed as a single piece. In other words, the in-line laser sections 310-1 to 310-n may be fabricated together on the same chip.

Although the illustrated embodiment shows the laser sections 310-1 to 310-n having approximately the same length, one or more of the laser sections 310-1 to 310-n may have different lengths. Although the illustrated embodiments show three (3) laser sections, a multiple-section tunable laser may include other numbers of in-line laser sections.

Each of the in-line laser sections 310-1 to 310-n may be thermally tuned such that laser light is emitted from the front facet 306 of the laser body 302 at a selected wavelength $\lambda_s$, such as a selected channel wavelength, within one of the respective wavelength ranges. The laser light emitted from the tunable laser 300 may be predominantly at the selected wavelength $\lambda_s$ and light at wavelengths other than the selected channel may be minimized to improve performance (e.g., reduce noise). The laser light emitted from the tunable laser 300 may also be filtered to remove a substantial portion or all of the wavelengths other than the selected wavelength.

Laser driver circuitry 320 is electrically connected to each of the laser sections 310-1 to 310-n for driving each of the laser sections 310-1 to 310-n independently to generate laser light from a selected one of the laser sections 310-1 to 310-n and within the respective wavelength range. The laser driver circuitry 320 may include circuitry configured to drive semiconductor lasers by applying a driving current to induce lasing. In an optical transmitter, for example, the laser driver circuitry 320 modulates the respective one of the laser sections 310-1 to 310-n with an electrical signal, such as an RF signal, to produce a modulated optical signal at a selected channel wavelength.

The selected one of the laser sections 310-1 to 310-n (i.e. the laser section with a wavelength range including a selected channel wavelength) may be driven by a DC bias current above a threshold current (e.g., 12 mA) sufficient to cause lasing in that selected or active laser section. One or more of the other ones of the laser sections 310-1 to 310-n may be turned off or driven at a lower DC bias current below the threshold current that causes lasing. For example, the laser section(s) between the active laser section and the back facet 404 may be turned off. The laser sections between the active laser section and the front facet 306 may be driven at the lower driving current to be made sufficiently transparent to reduce loss, but without lasing, when the laser light from the active laser section passes through.

A temperature control system 330 is thermally coupled to each of the laser sections 310-1 to 310-n for thermally tuning each of the laser sections 310-1 to 310-n to a selected wavelength within the respective wavelength range. The laser sections 310-1 to 310-n may be thermally tuned using any configuration or technique capable of tuning to a selected wavelength in response to temperature changes. The temperature control system 330 may include one or more temperature control devices, such as thermoelectric coolers (TECs) and/or resistive heaters, for changing a temperature of each laser section sufficient to change the wavelength generated within that laser section. The temperature of each of the laser sections 310-1 to 310-n may be changed using the same temperature control device or using individual temperature control devices thermally coupled to the respective laser sections 310-1 to 310-n. The temperature control system 330 may also include temperature sensors and/or wavelength monitors and control circuitry. The control circuitry may cause the temperature control devices to set the temperature, for example, in response to a monitored temperature at the tunable laser 300 or in response to a monitored wavelength emitted by the tunable laser 300.

As illustrated, for example, the laser section 310-1 may be driven and tuned to generate laser light at a channel wavelength within the wavelength range $\lambda_1$-$\lambda_x$, the laser section 310-2 may be driven and tuned to generate laser light at a channel wavelength within the wavelength range $\lambda_x$-$\lambda_y$, and the laser section 310-n may be driven and tuned to generate laser light at a channel wavelength within the wavelength range $\lambda_y$-$\lambda_z$. Thus, the multiple-section tunable laser 300 may be used to generate and emit a selected channel wavelength $\lambda_s$ from z channel wavelengths by driving and thermally tuning one of the sections 310-1 to 310-n. By using the multiple in-line thermally tunable laser sections 310-1 to 310-n with different respective wavelength ranges, the tunable laser 300 is capable of being tuned to a wider range of channel wavelengths within a smaller temperature range.

In one example with sixteen (16) channels, the multiple section tunable laser 300 may include three (3) in-line laser sections and each respective wavelength range may cover about 4 nm and may include at least five (5) channel wavelengths. Although the wavelength shift with temperature is generally a function of the material properties, in one example, the wavelength in each of the laser sections may change by about 0.1 nm/° C. Thus, each laser section should be tunable to about 5 or 6 different channel wavelengths in different respective wavelength ranges in the C-band using the same temperature range of about Δ40° C.

Additional detail regarding a tunable laser with multiple in-line sections is provided in U.S. patent application Ser. No. 13/916,652 filed on Jun. 13, 2013, which is fully incorporated herein by reference.

Figure 4:
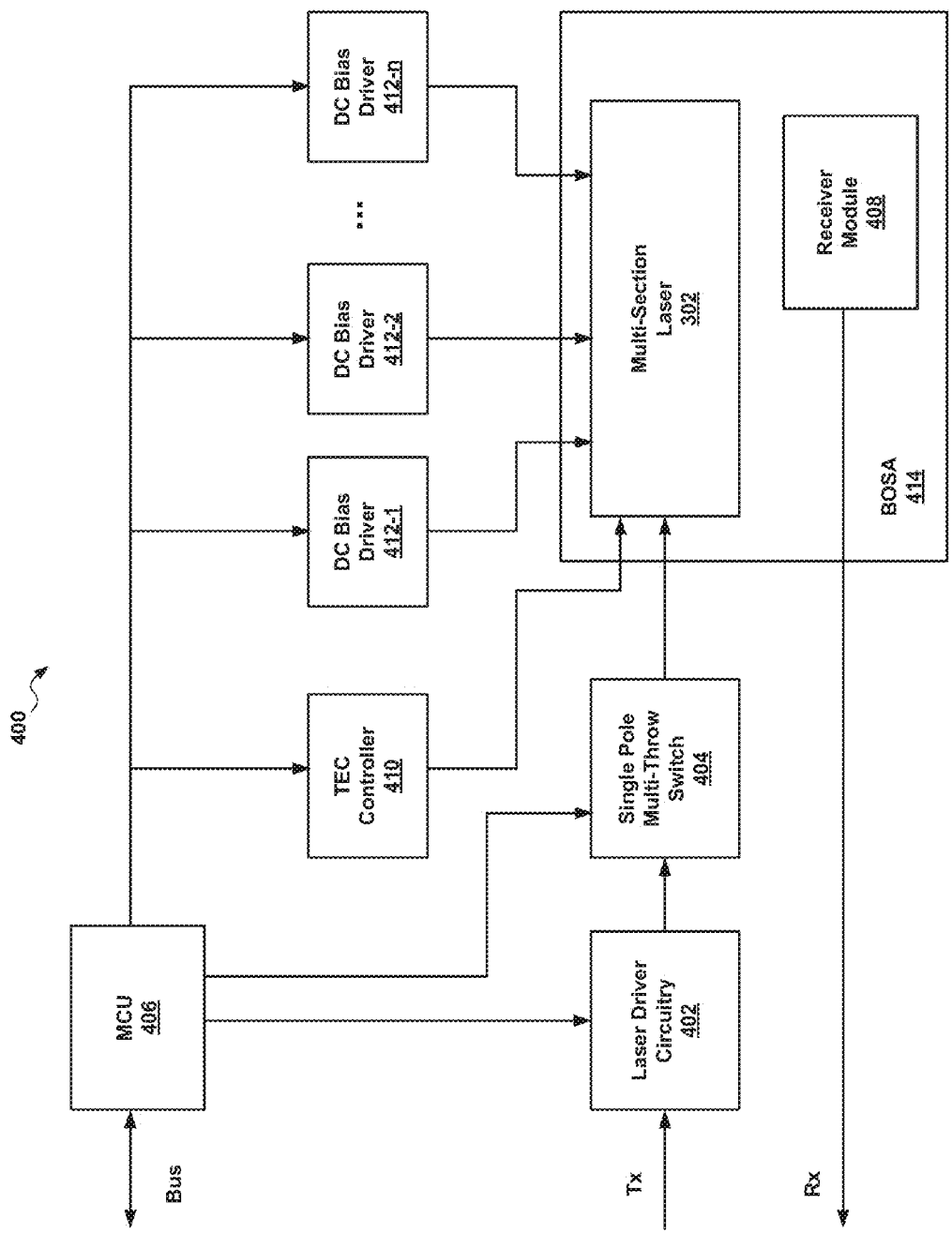
FIG. 4 is a schematic diagram of a tunable ONU transceiver circuit with a switchable laser driver, consistent with an embodiment of the present disclosure.

Referring to FIG. 4, a tunable ONU transceiver circuit 400, with a switchable laser driver, is described in greater detail. The tunable ONU transceiver circuit 400 includes a laser driver circuit 402 configured to provide a modulating signal, for example an RF signal, to modulate a laser for transmission over the optical network. A single pole multi-throw switch 404 may be configured to selectively couple the laser driver 402 to one of the in-line sections of the multi-section laser 302 corresponding to the desired transmission wavelength range. For example, the switch 404 may be a single pole 3-throw switch in the case of a 3 section laser. The switch 404 may be an RF switch and may be under the control of a processor or micro-controller (MCU) 406 which may receive data/commands, for example over a digital bus, from an external entity that is employing the ONU. In some embodiments, the digital bus may conform to the inter-integrated circuit ($I^2C$) standard or the small form factor (SFF) multi-source agreement (MSA) standard.

Thermal controller module 410, which may be a TEC controller, is configured to adjust and/or maintain the temperature of the laser 302. As described previously, temperature control may be used to fine tune the laser output to a desired wavelength within a selected one of the wavelength ranges associated with each of the laser sections. The TEC controller 410 may also be under control of the MCU 406.

DC bias driver circuits 412-1, . . . 412-n may be provided such that each laser section is associated with a DC bias driver configured to provide a bias current to that section. The bias current, for a selected laser section, may be set to a value that exceeds a threshold value which induces lasing in that section. For some other laser sections, for example those sections between the selected section and the transmitting end of the laser, the bias current may be set to a lower value that causes those laser sections to be transparent but not lase. For the remaining sections, for example those sections between the selected section and the other (non-transmitting) end of the laser, the bias current may be set to a still lower value that causes those sections to be turned off.

The DC bias driver circuits 412-1, . . . 412-n may also be under control of the MCU 406. For example, the MCU may be configured to receive a request or instruction to tune the laser to a desired wavelength. In response to that request, the MCU may: (1) determine to which section the laser driver will be switched; (2) determine the appropriate temperature adjustment for the laser; and (3) determine the appropriate DC biasing for each of the sections. The MCU may further be configured to generate the control signals necessary to achieve these conditions. The MCU may operate based on software execution/programming, firmware, hardware or any combination thereof.

The multi-section laser 302 may be part of a bi-directional optical sub assembly 414 that also includes a receiver module 408 to receive optical signals from the optical network. The receiver module 408 may include a photodetector, amplifier and/or any other associated circuitry, including biasing circuitry (not shown) to receive optical signals from the network. In some embodiments, the photodetector may be a PIN diode or an avalanche photodiode (APD) and the amplifier may include a transimpedance amplifier (TIA) and/or a limiting amplifier.

Figure 5:
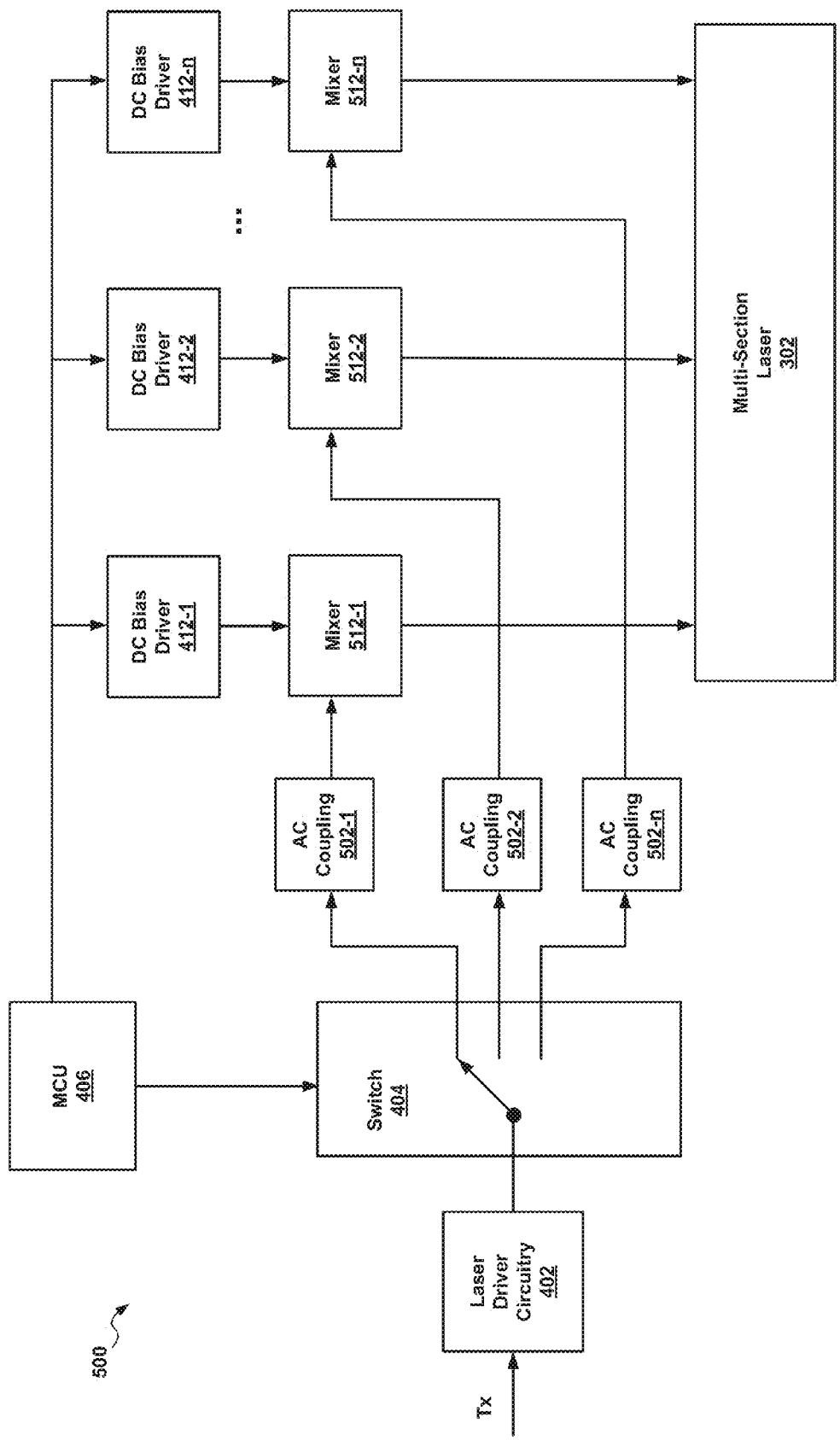
FIG. 5 is a more detailed schematic diagram of a multiple-section tunable laser system with a switchable laser driver, consistent with another embodiment of the present disclosure.

Referring to FIG. 5, a multiple-section tunable laser system 500 with a switchable laser driver is described in greater detail. Switch 404 is shown to selectively direct the modulating signal from driver 402 to an AC coupling circuit 502 associated with the selected section of laser 302. The AC coupling circuit may be configured to provide impedance matching between the driver and the associated laser section. Impedance matching allows for increased signal transmission (decreased reflection) to the laser. Because each laser section may generally have a different impedance, this embodiment allows for multiple AC coupling circuits 502-1, . . . 502-n to be configured with different impedance matching characteristics tailored to each laser section. Impedance matching may generally be achieved by adjusting the inductance and/or capacitance of the AC coupling circuit.

The switch selected signal (in this illustration, the topmost switch position routing to the first or left most laser section) is provided through the AC coupling circuit 502-1 to a mixer circuit 512-1. The mixer is configured to mix the modulating signal with the DC bias current and provide the resulting mixed signal to the selected laser section so that the signal may be optically transmitted over the network at the desired wavelength. Of course the switch 404 may be set to other positions, for example under the control of the MCU 406, such that the laser driver signal is routed to any of AC coupling circuits 502-2, . . . 502-n for mixing with DC bias drivers 412-2, . . . 412-n by mixer circuits 512-2, . . . 512-n, respectively, and then supplied to the appropriate in-line section of laser 302.

In some embodiments, the tunable ONU transceiver circuit 400 may conform to one or more of the dimensions of the Small Form Factor (SFF) or the Small Form Factor Pluggable (SFP) transceiver size specification. These dimensions are set forth, for example, in the "Small Form Factor Transceiver Multisource Agreement," dated Jan. 6, 1998, and the "Small Form Factor Pluggable Transceiver Multisource Agreement," dated Sep. 14, 2000. It will be appreciated that the RF switch 404, which enables the use of a single laser driver circuit 402 instead of multiple drivers, one for each laser section, allows for a decrease in size (and cost) for the ONU. This may contribute, at least in part, to the ability to conform to the SFF/SFP specification.

Accordingly, a switched driver for a multiple section tunable laser, with in-line thermally tunable laser sections, consistent with embodiments described herein, may provide relatively inexpensive lasers in a relatively smaller form factor by employing a single laser driver that is selectively switched to a desired in-line laser section. The tunable laser is capable of being tuned within a relatively wide range for WDM applications without requiring a wide range of temperature changes.

Consistent with one embodiment, a tunable laser includes a semiconductor laser body including a plurality of in-line laser sections each configured to be driven independently to generate laser light at a wavelength within a different respective wavelength range. Each of the plurality of in-line laser sections is tunable in response to temperature changes to generate a selected wavelength within the respective wavelength range. A switch module is configured to couple a signal from a laser driver to a selected one of the plurality of in-line laser sections, wherein the signal modulates the laser light generated by the in-line laser section.

Consistent with another embodiment, an optical networking unit includes a photodector for receiving an optical signal at a received channel wavelength and a tunable laser for transmitting an optical signal at a transmitted channel wavelength. The received channel wavelength and the transmitted channel wavelength are in one of the C-band or the L-band. The tunable laser includes a semiconductor laser body including a plurality of in-line laser sections each configured to be driven independently to generate laser light at a wavelength within a different respective wavelength range. Each of the plurality of in-line laser sections is tunable in response to temperature changes to generate a selected wavelength within the respective wavelength range. The ONU further includes a switch module configured to couple a signal from a laser driver to a selected one of the plurality of in-line laser sections. The signal modulates the laser light generated by the in-line laser section.

Consistent with a further embodiment, a wavelength division multiplexed (WDM) system includes a plurality of terminals associated with different respective channel wavelengths and configured to transmit optical signals on the different respective channel wavelengths. At least one of the plurality of terminals includes at least a tunable laser configured to be tuned to a respective one of the channel wavelengths. The tunable laser includes a semiconductor laser body including a plurality of in-line laser sections each configured to be driven independently to generate laser light at a wavelength within a different respective wavelength range. Each of the plurality of in-line laser sections is tunable in response to temperature changes to generate a selected wavelength within the respective wavelength range. The tunable laser further includes a switch module configured to couple a signal from a laser driver to a selected one of the plurality of in-line laser sections. The signal modulates the laser light generated by the in-line laser section.

Consistent with yet another embodiment, a method includes: providing a tunable laser comprising a semiconductor laser body including a plurality of in-line laser sections configured to generate laser light within different respective wavelength ranges; switchably coupling a modulating signal from a laser driver to a selected one of the in-line laser sections to generate laser light from the selected one of the in-line laser sections within a respective wavelength range; and tuning the tunable laser such that the laser light is generated in the selected one of the in-line laser sections at a selected wavelength within the respective wavelength range.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A tunable laser comprising:
a semiconductor laser body including a plurality of in-line laser sections each configured to be driven independently to generate laser light at a wavelength within a different respective wavelength range, wherein each of the plurality of in-line laser sections are arranged in-line from a back facet to a front facet of the semiconductor laser body such that the laser light generated by one of the in-line laser sections proximate the back facet passes through one of the in-line laser sections proximate the front facet and such that laser light generated from all of the in-line sections is emitted from the same front facet, wherein each of the plurality of in-line laser sections is tunable in response to temperature changes to generate a selected wavelength within the respective wavelength range;
a switch module configured to couple a signal from a laser driver to a selected one of said plurality of in-line laser sections, wherein said signal modulates said laser light generated by said in-line laser section; and
an alternating-current (AC) coupling circuit to perform impedance matching between the laser driver and the selected laser section by adjusting at least one of an inductance or a capacitance of the AC coupling circuit.

2. The tunable laser of claim 1, further comprising a temperature controller configured to adjust said temperature changes.

3. The tunable laser of claim 1, further comprising a plurality of direct-current (DC) bias drivers, each DC bias driver associated with one of said in-line laser sections, said DC bias drivers configured to bias said selected in-line section to a lasing state and to bias non-selected in-line sections to one of a transparent state or an off state.

4. The tunable laser of claim 3, further comprising a processor configured to receive digital data and to control, based on said digital data: said selection by said switch module; said temperature controller adjustments; and said DC bias drivers.

5. The tunable laser of claim 1, wherein said tunable laser is a component of an Optical Networking Unit (ONU), said ONU conforming to one of a Small Form Factor (SFF) or a Small Form Factor Pluggable (SFP) transceiver size specification.

6. The tunable laser of claim 1, wherein the plurality of in-line laser sections include three laser sections and said switch module is a single pole three throw radio frequency (RF) switch.

7. The tunable laser of claim 1, wherein each said different respective wavelength range includes channel wavelengths in the C-band.

8. An optical networking unit comprising:
a photodetector for receiving an optical signal at a received channel wavelength, wherein the received channel wavelength is in one of the L-band or the C-band;
a tunable laser for transmitting an optical signal at a transmitted channel wavelength, wherein the transmitted channel wavelength is in the other of the L-band or the C-band, the tunable laser comprising a semiconductor laser body including a plurality of in-line laser sections each configured to be driven independently to generate laser light at a wavelength within a different respective wavelength range, wherein each of the plurality of in-line laser sections are arranged in-line from a back facet to a front facet of the semiconductor laser body such that the laser light generated by one of the in-line laser sections proximate the back facet passes through one of the in-line laser sections proximate the front facet and such that laser light generated from all of the in-line sections is emitted from the same front facet, wherein the wavelength of the light generated by each of the laser sections is tunable to the transmitted channel wavelength within the respective wavelength range in response to temperature changes;
a laser driver circuit configured to provide a modulating signal to modulate said tunable laser for transmission over an optical network;
a plurality of direct-current (DC) bias drivers, each DC bias driver associated with one of said in-line laser sections, said DC bias drivers configured to bias said selected in-line section to a lasing state and to bias non-selected in-line sections to one of a transparent state or an off state; and
a switch module configured to couple a signal from said laser driver circuit to a selected one of said plurality of in-line laser sections, wherein said signal modulates said laser light generated by said selected one of said plurality of in-line laser sections.

9. The optical networking unit of claim 8, further comprising a temperature controller configured to adjust said temperature changes.

10. The optical networking unit of claim 9, further comprising a processor configured to receive digital data and to control, based on said digital data: said selection by said switch module; said temperature controller adjustments; and said DC bias drivers.

11. The optical networking unit of claim 8, wherein said optical networking unit conforms to one of a Small Form Factor (SFF) or a Small Form Factor Pluggable (SFP) transceiver size specification.

12. The optical networking unit of claim 8, further comprising an alternating-current (AC) coupling circuit configured to provide impedance matching between said laser driver and said selected in-line laser section.

13. A wavelength division multiplexed (WDM) system comprising:
a plurality of terminals associated with different respective channel wavelengths and configured to transmit optical signals on the different respective channel wavelengths, at least one of the plurality of terminals including at least a tunable laser configured to be tuned to a respective one of the channel wavelengths, the tunable laser comprising:
a semiconductor laser body including a plurality of in-line laser sections each configured to be driven independently to generate laser light at a wavelength within a different respective wavelength range, wherein each of the plurality of in-line laser sections are arranged in-line from a back facet to a front facet of the semiconductor laser body such that the laser light generated by one of the in-line laser sections proximate the back facet passes through one of the in-line laser sections proximate the front facet and such that laser light generated from all of the in-line sections is emitted from the same front facet, wherein the wavelength of the light generated by each of the laser sections is tunable to the respective one of channel wavelengths within the respective wavelength range in response to temperature changes;
a laser driver circuit configured to provide a modulating signal to modulate said tunable laser for transmission over an optical network;

a plurality of direct-current (DC) bias drivers, each DC bias driver associated with one of said in-line laser sections, said DC bias drivers configured to bias said selected in-line section to a lasing state and to bias non-selected in-line sections to one of a transparent state or an off state; and a switch module configured to couple a signal from said laser driver circuit to a selected one of said plurality of in-line laser sections, wherein said signal modulates said laser light generated by said selected one of said plurality of in-line laser sections.

14. The WDM system of claim 13, wherein the plurality of terminals include optical networking terminals (ONTs) in a WDM passive optical network (PON).

15. The WDM system of claim 13, further comprising:
at least one optical line terminal (OLT) configured to receive aggregate WDM optical signals including the channel wavelengths;
at least one branching point coupled between the OLT and the plurality of ONTs, the branching point being configured to combine the optical signals at the channel wavelengths; and
a trunk optical path coupling the OLT and the branching point.

16. A method comprising:
providing a tunable laser comprising a semiconductor laser body including a plurality of in-line laser sections configured to generate laser light within different respective wavelength ranges wherein each of the plurality of in-line laser sections are arranged in-line from a back facet to a front facet of the semiconductor laser body such that the laser light generated by one of the in-line laser sections proximate the back facet passes through one of the in-line laser sections proximate the front facet and such that laser light generated from all of the in-line sections is emitted from the same front facet;
switchably coupling a modulating signal from a laser driver to a selected one of the in-line laser sections to generate laser light from the selected one of the in-line laser sections within a respective wavelength range;
performing impedance matching between the laser driver and the selected laser section by adjusting at least one of an inductance or a capacitance;
tuning the tunable laser such that the laser light is generated in the selected one of the in-line laser sections at a selected wavelength within the respective wavelength range; and
emitting the laser light from the front facet of the semiconductor body.

17. The method of claim 16, wherein the selected one of the in-line laser sections is DC-biased to a current level sufficient to induce lasing within the selected one of the in-line laser sections and wherein the others of the in-line laser sections are DC-biased to an off state or to a transparent state.

18. The method of claim 16, wherein the tunable laser is tuned by changing a temperature of the laser.

19. The method of claim 16, wherein each of the in-line laser sections is configured to generate laser light within a respective wavelength range including at least five channel wavelengths in the C-band.

* * * * *